(12) United States Patent
Ito

(10) Patent No.: US 10,243,122 B2
(45) Date of Patent: Mar. 26, 2019

(54) METHOD OF MANUFACTURING LIGHT-EMITTING DEVICE

(71) Applicant: TOYODA GOSEI CO., LTD., Kiyosu-shi (JP)

(72) Inventor: Yuhki Ito, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/287,567

(22) Filed: Oct. 6, 2016

(65) Prior Publication Data

US 2017/0110635 A1 Apr. 20, 2017

(30) Foreign Application Priority Data

Oct. 15, 2015 (JP) .................................. 2015-203906

(51) Int. Cl.
*H01L 33/52* (2010.01)
*H01L 33/60* (2010.01)
(Continued)

(52) U.S. Cl.
CPC ............ *H01L 33/60* (2013.01); *H01L 33/483* (2013.01); *H01L 33/507* (2013.01); *H01L 33/52* (2013.01);
(Continued)

(58) Field of Classification Search
CPC ....... H01L 33/483; H01L 33/52; H01L 33/54; H01L 33/60; H01L 33/56
See application file for complete search history.

(56) References Cited

U.S. PATENT DOCUMENTS

| 6,638,780 B2 | 10/2003 | Fukasawa et al. |
| 7,187,009 B2 | 3/2007 | Fukasawa et al. |

(Continued)

FOREIGN PATENT DOCUMENTS

| JP | 2002-368281 A | 12/2002 |
| JP | 2012-222319 A | 11/2012 |
| JP | 2013-065812 A | 4/2013 |

OTHER PUBLICATIONS

Notification of Reasons for Refusal dated Jul. 31, 2018 in Japanese Application No. 2015-203906 with an English translation thereof.

*Primary Examiner* — Selim U Ahmed
*Assistant Examiner* — Evan G Clinton
(74) *Attorney, Agent, or Firm* — McGinn I.P. Law Group, PLLC.

(57) ABSTRACT

A method of manufacturing a light-emitting device includes providing a resin sheet that includes a lattice-patterned reflective material-containing portion and film-shaped phosphor-containing portions covering lattice openings of the reflective material-containing portion, placing the resin sheet on a substrate mounting a plurality of light-emitting elements such that each of the plurality of light-emitting elements is surrounded by the reflective material-containing portion and is covered on the top with the phosphor-containing portion, after placing the resin sheet on the substrate, softening the resin sheet by heating such that the phosphor-containing portions are adhered to the respective upper surfaces of the plurality of light-emitting elements and the reflective material-containing portion or the phosphor-containing portions is/are adhered to the side surfaces of the plurality of light-emitting elements, and curing the resin sheet and then cutting the substrate and the resin sheet to singulate individual light-emitting devices.

20 Claims, 7 Drawing Sheets

(51) Int. Cl.
*H01L 33/48* (2010.01)
*H01L 33/54* (2010.01)
*H01L 33/56* (2010.01)
*H01L 33/50* (2010.01)

(52) U.S. Cl.
CPC .............. *H01L 33/54* (2013.01); *H01L 33/56* (2013.01); *H01L 2933/0041* (2013.01); *H01L 2933/0058* (2013.01)

(56) References Cited

U.S. PATENT DOCUMENTS

| | | |
|---|---|---|
| 2002/0187570 A1 | 12/2002 | Fukasawa et al. |
| 2004/0041165 A1 | 3/2004 | Fukasawa et al. |
| 2012/0187399 A1* | 7/2012 | Fukuda ............. H01L 29/78603 257/43 |
| 2012/0261700 A1* | 10/2012 | Ooyabu ................. H01L 33/46 257/98 |
| 2012/0262054 A1* | 10/2012 | Ooyabu ................. H01L 33/56 313/498 |
| 2015/0207045 A1* | 7/2015 | Wada .................... H01L 33/505 257/88 |
| 2016/0172550 A1* | 6/2016 | Suto ...................... H01L 33/504 257/89 |

\* cited by examiner

METHOD OF MANUFACTURING LIGHT-EMITTING DEVICE

The present application is based on Japanese patent application No. 2015-203906 filed on Oct. 15, 2015, the entire contents of which are incorporated herein by reference.

BACKGROUND OF THE INVENTION

1. Field of the Invention

The invention relates to a method of manufacturing a light-emitting device.

2. Description of the Related Art

A conventional method of manufacturing a light-emitting device is known, which includes a step of sealing plural light-emitting elements on a substrate with an island-shaped phosphor-containing translucent resin, a step of filling gaps of the island-shaped translucent resin with a light-reflecting resin, and a step of cutting by a dicing blade to singulate individual light-emitting devices each of which includes a light-emitting element, the phosphor-containing translucent resin and the light-reflecting resin (see, e.g., JP-A-2002-368281).

Meanwhile, another conventional method of manufacturing a light-emitting device is known, which includes a step of forming a member in which a ring-shaped reflector and a wavelength-converting material containing phosphor surrounded by the reflector are formed on a translucent plate, and a step of placing the member, with the reflector and the wavelength-converting material facing downward, on a substrate mounting a light-emitting element such that the reflector and the wavelength-converting material are respectively located around and above the light-emitting element (see, e.g., JP-A-2013-065812).

SUMMARY OF THE INVENTION

It is an object of the invention to provide a method of a manufacturing a light-emitting device that allows the easy manufacture of a light-emitting device in which a light-emitting element is covered with a wavelength-converting layer and is surrounded by a reflector.

(1) According to an embodiment of the invention, a method of manufacturing a light-emitting device comprises:

providing a resin sheet that comprises a lattice-patterned reflective material-containing portion and film-shaped phosphor-containing portions covering lattice openings of the reflective material-containing portion;

placing the resin sheet on a substrate mounting a plurality of light-emitting elements such that each of the plurality of light-emitting elements is surrounded by the reflective material-containing portion and is covered on the top with the phosphor-containing portion;

after placing the resin sheet on the substrate, softening the resin sheet by heating such that the phosphor-containing portions are adhered to the respective upper surfaces of the plurality of light-emitting elements and the reflective material-containing portion or the phosphor-containing portions is/are adhered to the side surfaces of the plurality of light-emitting elements; and curing the resin sheet and then cutting the substrate and the resin sheet to singulate individual light-emitting devices each comprising a light-emitting element on the substrate, an annular reflector comprising the reflective material-containing portion and surrounding the light-emitting element, and a wavelength-converting layer comprising the phosphor-containing portion and covering the upper surface of the light-emitting element.

In the above embodiment (1) of the invention, the following modifications and changes can be made.

(i) The resin sheet is softened while performing a degassing process.

(ii) The degassing process comprises a vacuum degassing.

(iii) The resin sheet is provided in a semi-cured state while being held by a frame.

EFFECTS OF THE INVENTION

According to an embodiment of the invention, a method of a manufacturing a light-emitting device can be provided that allows the easy manufacture of a light-emitting device in which a light-emitting element is covered with a wavelength-converting layer and is surrounded by a reflector.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiment

Configuration of Resin Sheet

Figure 1:
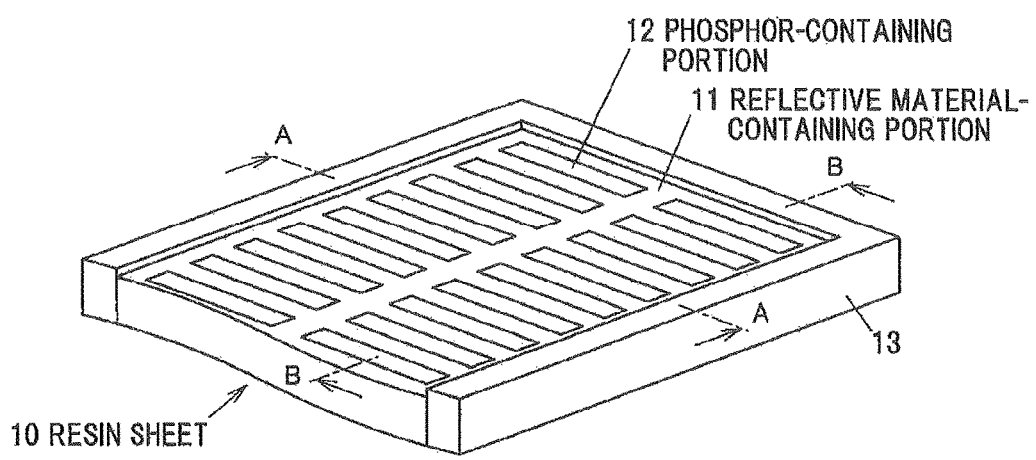
FIG. 1 is a perspective view showing a resin sheet in an embodiment.
Figure 2A:
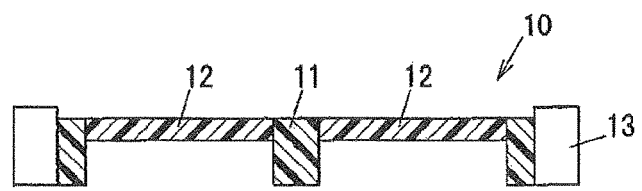
FIGS. 2A and 2B are vertical cross-sectional views showing the resin sheet respectively taken on line A-A and line B-B in FIG. 1.
Figure 2B:
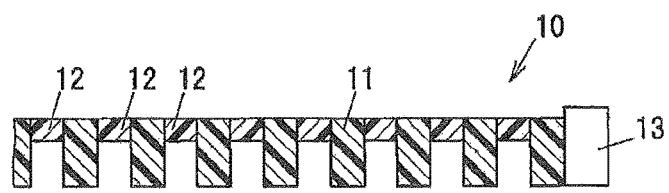

FIG. 1 is a perspective view showing a resin sheet 10 in an embodiment. FIGS. 2A and 2B are vertical cross-sectional views showing the resin sheet 10 respectively taken on line A-A and line B-B in FIG. 1.

The resin sheet 10 has a lattice-patterned reflective material-containing portion 11 and film-shaped phosphor-containing portions 12 covering lattice openings of the reflective material-containing portion 11. The resin sheet 10 is surrounded and held by a frame 13. The resin sheet 10 is configured that the phosphor-containing portions 12 are formed inside holes of the lattice of the reflective material-containing portion 11. The frame 13 is a member for maintaining the shape of the resin sheet 10 and does not need to be provided when deformation of the resin sheet 10 is small without using the frame 13.

A base material of the reflective material-containing portion 11 and the phosphor-containing portion 12 is a thermosetting resin such as epoxy resin, modified epoxy resin, silicone resin, modified silicone resin, acrylate resin or urethane resin. The reflective material-containing portion 11 contains white pigment such as titanium dioxide in the thermosetting resin, while the phosphor-containing portion 12 contains phosphor particles in the thermosetting resin.

Fluorescence color of the phosphor particles contained in the phosphor-containing portion 12 is not specifically limited and, for example, particles of BOS (barium orthosilicate) phosphor or YAG (yttrium aluminum garnet) phosphor are used as yellow phosphor particles. For example, when emission color of a light-emitting element 21 (described later) is blue and fluorescence color of the phosphor is yellow, emission color of a light-emitting device 30 (described later) is white.

Method of Manufacturing the Light-Emitting Device

FIGS. 3A to 3D are vertical cross-sectional views showing a process of manufacturing a light-emitting device in the embodiment.

Figure 3A:
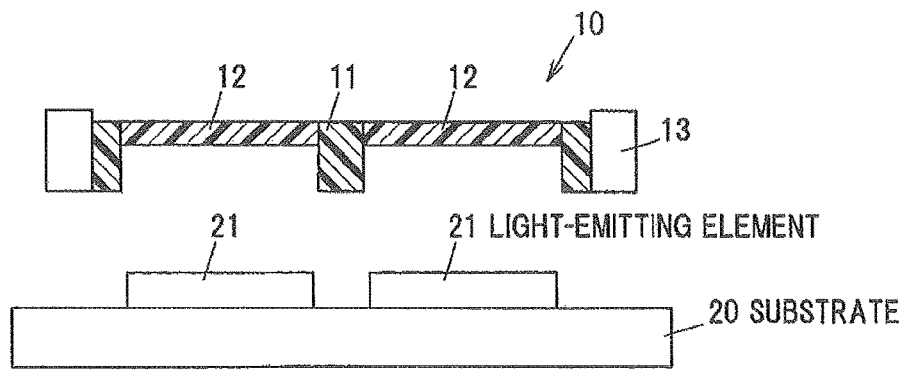
FIGS. 3A to 3D are vertical cross-sectional views showing a process of manufacturing a light-emitting device in the embodiment.

Firstly, as shown in FIG. 3A, the resin sheet 10 is positioned with respect to a substrate 20 mounting plural light-emitting elements 21 such that the phosphor-containing portions 12 are located right above the light-emitting elements 21.

The substrate 20 is, e.g., a ceramic substrate such as $Al_2O_3$ substrate or MN substrate, a metal substrate such as Al substrate or Cu substrate of which surface is covered with an insulating film, or a glass epoxy substrate. The substrate 20 also has a wiring (not shown) to be a power supply path to the light-emitting elements 21.

The light-emitting element 21 is, e.g., an LED (Light-Emitting Diode) chip or an LD (Laser Diode) chip, etc. The light-emitting element 21 may be either a face-up element or a face-down element.

Figure 3B:
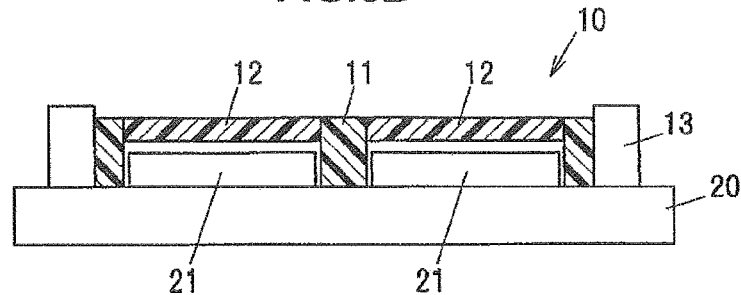

Next, as shown in FIG. 3B, the resin sheet 10 is placed on the substrate 20 such that each of the plural light-emitting elements 21 is surrounded by the reflective material-containing portion 11 and is covered on the top with the phosphor-containing portion 12. The resin sheet 10 is in a semi-cured state at this stage.

Figure 3C:
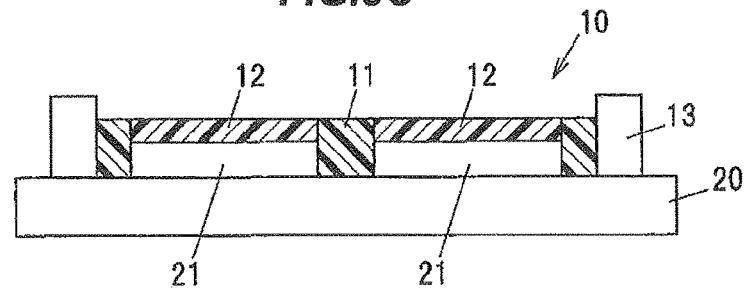

Next, as shown in FIG. 3C, the resin sheet 10 is softened by heating such that the phosphor-containing portions 12 are adhered to the respective upper surfaces of the plural light-emitting elements 21 and the reflective material-containing portion 11 is adhered to the side surfaces of the plural light-emitting elements 21.

At this time, the resin sheet 10 is softened while performing a degassing process. This allows the air between the phosphor-containing portions 12/the reflective material-containing portion 11 and the light-emitting elements 21 to be efficiently evacuated, and the phosphor-containing portions 12 and the reflective material-containing portion 11 thus can be adhered to the light-emitting elements 21 more reliably. Vacuum degassing or vibration is used as the degassing process.

Figure 3D:
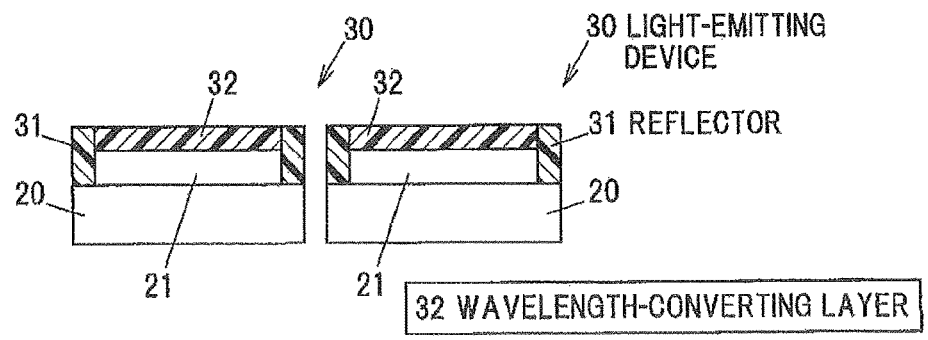

Next, as shown in FIG. 3D, after curing the resin sheet by heating to a curing temperature, the substrate 20 and the resin sheet 10 are cut by dicing, etc., to singulate individual light-emitting devices 30. Each light-emitting device 30 has the light-emitting element 21 on the substrate 20, an annular reflector 31 formed of the reflective material-containing portion 11 and surrounding the light-emitting element 21, and a wavelength-converting layer 32 formed of the phosphor-containing portion 12 and covering the upper surface of the light-emitting element 21.

Figure 4A:
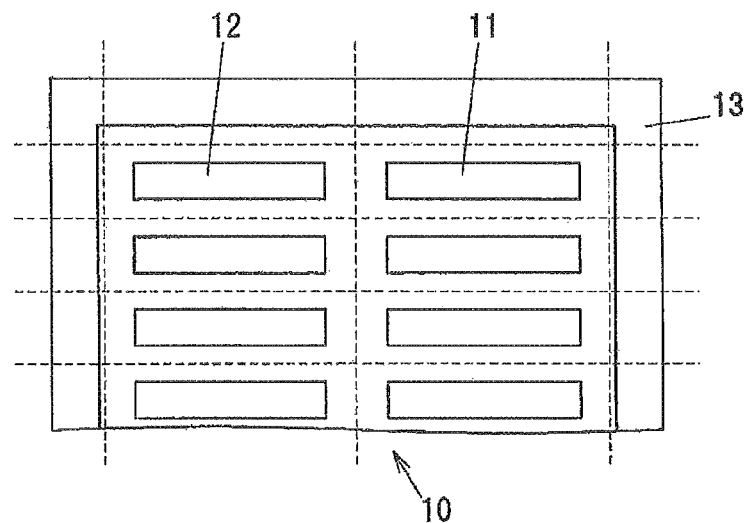
FIGS. 4A and 4B are top views respectively showing the states before and after cutting a substrate and the resin sheet.
Figure 4B:
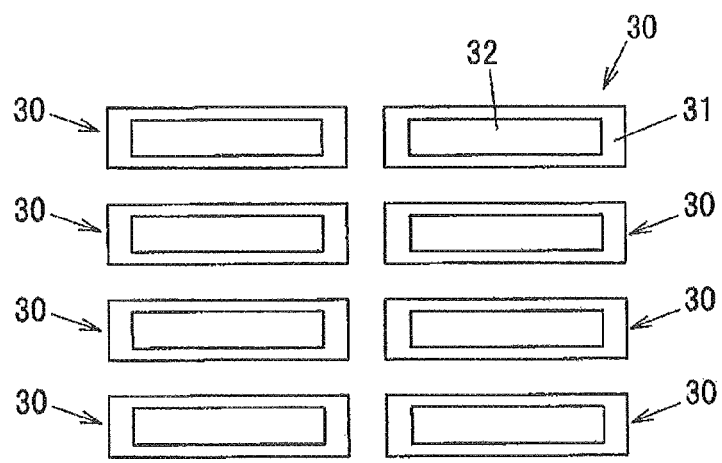

FIGS. 4A and 4B are top views respectively showing the states before and after cutting the substrate 20 and the resin sheet 10. Dotted lines in FIG. 4A indicate the cutting positions.

Figure 5A:
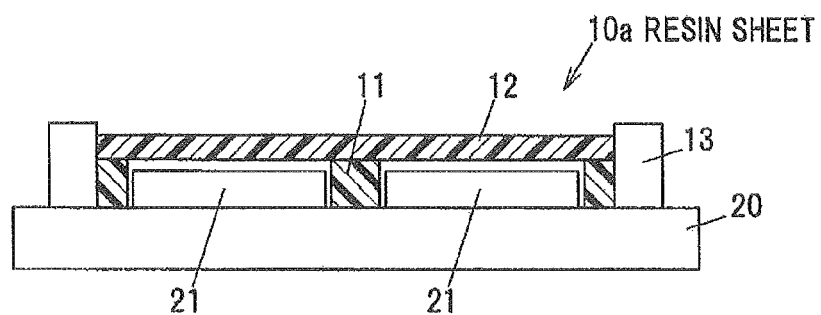
FIGS. 5A to 5C are vertical cross-sectional views showing a modification of the process of manufacturing the light-emitting device in the embodiment.
Figure 5B:
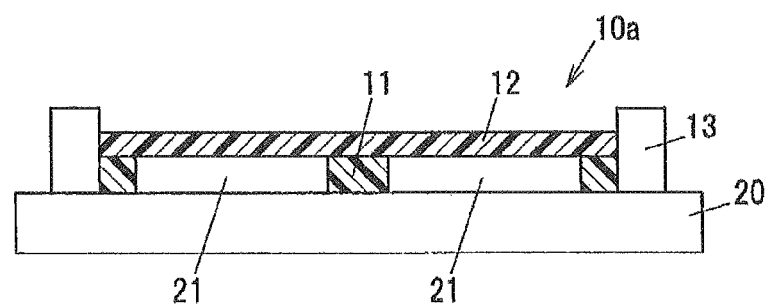
Figure 5C:
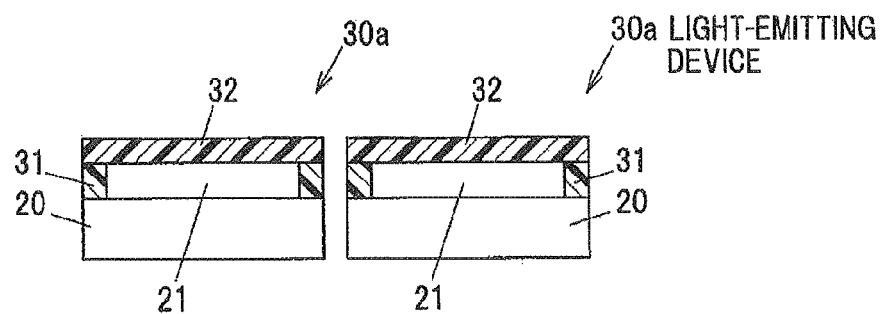

FIGS. 5A to 5C are vertical cross-sectional views showing a modification of the process of manufacturing the light-emitting device in the embodiment. FIGS. 5A to 5C show an example using a resin sheet which has a different configuration from the resin sheet 10. The process shown in FIGS. 5A to 5C corresponds to the process shown in FIGS. 3B to 3D.

As shown in FIG. 5A, a resin sheet 10a is configured that the upper surface of the lattice-patterned reflective material-containing portion 11 is covered with a single phosphor-containing portion 12. Also in the resin sheet 10a, the phosphor-containing portion 12 covers the lattice openings of the reflective material-containing portion 11 in the same manner as the resin sheet 10.

After performing the process up to singulation of light-emitting devices shown in FIGS. 5A to 5C in the same manner as the process shown in FIGS. 3B to 3D, light-emitting devices 30a shown in FIG. 5C are obtained. In the light-emitting device 30a, the upper surfaces of the light-emitting element 21 and the annular reflector 31 surrounding the light-emitting element 21 are covered with the wavelength-converting layer 32.

Figure 6A:
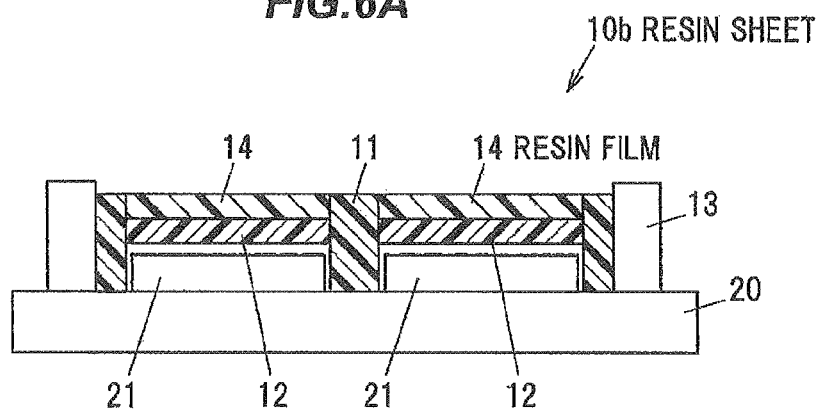
FIGS. 6A to 6C are vertical cross-sectional views showing another modification of the process of manufacturing the light-emitting device in the embodiment.
Figure 6B:
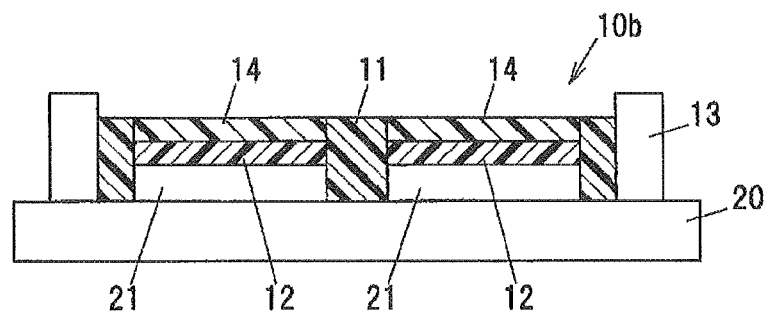
Figure 6C:
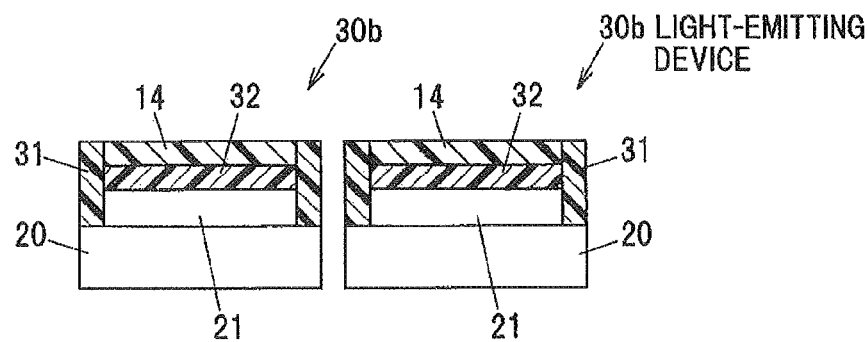

FIGS. 6A to 6C are vertical cross-sectional views showing another modification of the process of manufacturing the light-emitting device in the embodiment. FIGS. 6A to 6C show an example using a resin sheet which has a different configuration from the resin sheet 10. The process shown in FIGS. 6A to 6C corresponds to the process shown in FIGS. 3B to 3D.

As shown in FIG. 6A, a resin sheet 10b is configured that the phosphor-containing portions 12 are formed inside holes of the lattice of the reflective material-containing portion 11 and cover the lattice openings. In addition, the upper surfaces of the phosphor-containing portions 12 are covered with resin films 14.

A base material of the resin film 14 is a thermosetting resin in the same manner as the reflective material-containing portion 11 and the phosphor-containing portion 12, and the resin film 14 is a transparent resin not containing additives or a resin containing a light-scattering material.

After performing the process up to singulation of light-emitting devices shown in FIGS. 6A to 6C in the same manner as the process shown in FIGS. 3B to 3D, light-emitting devices 30b shown in FIG. 6C are obtained. In the light-emitting device 30b, the upper surface of the wavelength-converting layer 32 is covered with the resin film 14. The resin film 14 serves as a protective film for the wavelength-converting layer 32, and can reduce in-plane unevenness of light emission intensity in case of containing the light-scattering material.

Figure 7A:
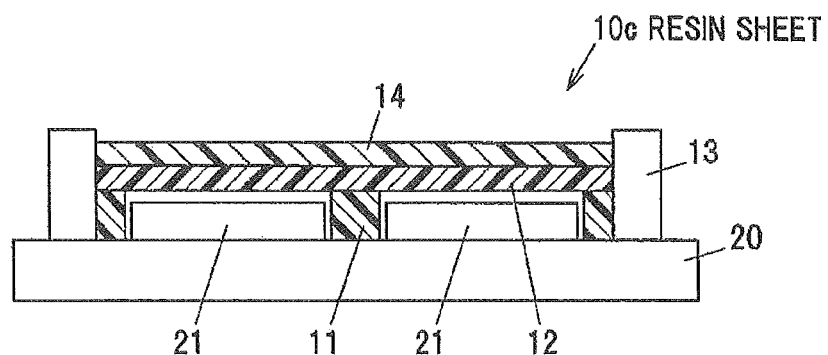
FIGS. 7A to 7C are vertical cross-sectional views showing another modification of the process of manufacturing the light-emitting device in the embodiment.
Figure 7B:
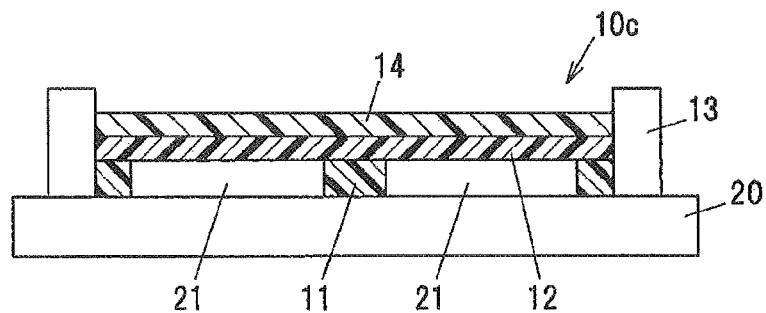
Figure 7C:
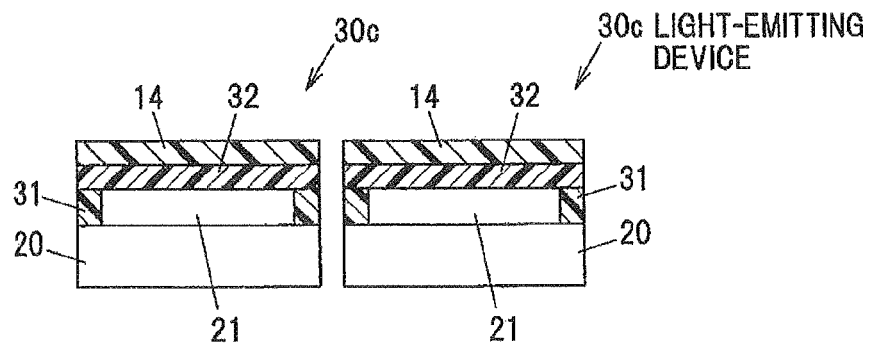

FIGS. 7A to 7C are vertical cross-sectional views showing another modification of the process of manufacturing the light-emitting device in the embodiment. FIGS. 7A to 7C show an example using a resin sheet which has a different configuration from the resin sheet 10. The process shown in FIGS. 7A to 7C corresponds to the process shown in FIGS. 3B to 3D.

As shown in FIG. 7A, a resin sheet 10c is configured that a single phosphor-containing portion 12 covers the upper surface of the lattice-patterned reflective material-containing portion 11 such that the lattice openings are covered. In addition, the upper surface of the phosphor-containing portion 12 is covered with a single resin film 14.

After performing the process up to singulation of light-emitting devices shown in FIGS. 7A to 7C in the same manner as the process shown in FIGS. 3B to 3D, light-emitting devices 30c shown in FIG. 7C are obtained. In the light-emitting device 30c, the upper surfaces of the light-emitting element 21 and the annular reflector 31 surrounding the light-emitting element 21 are covered with the wavelength-converting layer 32, and the upper surface of the wavelength-converting layer 32 is covered with the resin film 14. The resin film 14 serves as a protective film for the wavelength-converting layer 32, and can reduce in-plane unevenness of light emission intensity in case of containing the light-scattering material.

Figure 8A:
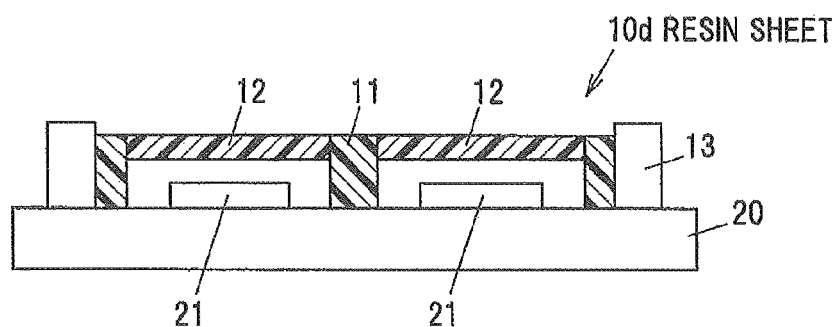
FIGS. 8A to 8C are vertical cross-sectional views showing another modification of the process of manufacturing the light-emitting device in the embodiment.
Figure 8B:
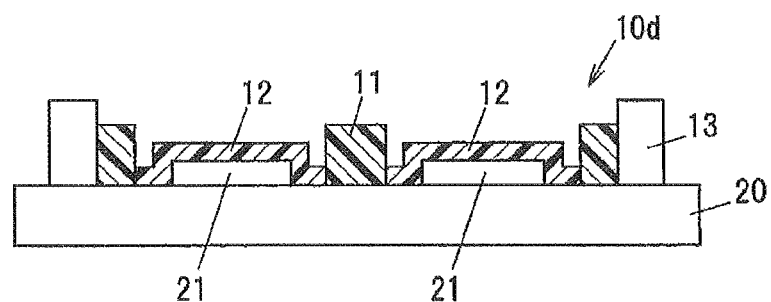
Figure 8C:
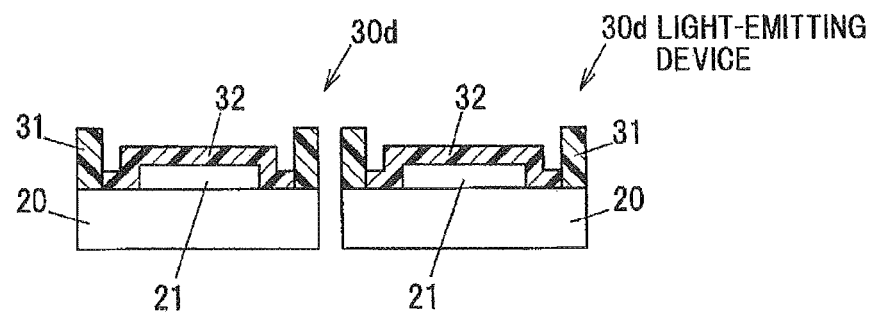

FIGS. 8A to 8C are vertical cross-sectional views showing another modification of the process of manufacturing the light-emitting device in the embodiment. FIGS. 8A to 8C show an example using the phosphor-containing portion 12 which is relatively large in size with respect to the light-emitting element. The process shown in FIGS. 8A to 8C corresponds to the process shown in FIGS. 3B to 3D.

As shown in FIG. 8A, a resin sheet 10d is configured that the phosphor-containing portion 12 is relatively large in size with respect to the light-emitting element 21.

In this case, when the resin sheet 10d is softened by heating, the phosphor-containing portion 12 is adhered to the upper and side surfaces of the light-emitting element 21, as shown in FIG. 8B.

Then, after performing the process up to singulation of light-emitting devices, light-emitting devices 30d shown in FIG. 8C are obtained. In the light-emitting device 30d, the light-emitting element 21 of which upper and side surfaces are covered with the wavelength-converting layer 32 is surrounded by the annular reflector 31.

Effects of the Embodiment

In the embodiment, it is possible to easily manufacture a light-emitting device in which a light-emitting element is covered with a wavelength-converting layer and is surrounded by a reflector.

Although the embodiment of the invention has been described, the invention is not intended to be limited to the embodiment and the various kinds of modifications can be implemented without departing from the gist of the invention.

For example, the shape of the holes of the lattice of the reflective material-containing portion 11 is not limited to square and may be circle.

In addition, the invention according to claims is not to be limited to the above-mentioned embodiment. Further, please note that all combinations of the features described in the embodiment are not necessary to solve the problem of the invention.

What is claimed is:

1. A method of manufacturing a light-emitting device, said method comprising:
    providing a resin sheet that comprises a lattice-patterned reflective material-containing portion and film-shaped phosphor-containing portions covering lattice openings of the reflective material-containing portion such that side surfaces of the resin sheet are surrounded and held by a frame;
    mounting a plurality of light-emitting elements on a substrate such that bottom surfaces of the plurality of light-emitting elements are disposed on an upper surface of the substrate;
    placing the resin sheet with the frame attached thereto on the substrate with the plurality of light-emitting elements mounted thereon while allowing the frame to surround and hold the side surfaces of the resin sheet such that each of the plurality of light-emitting elements is surrounded by the reflective material-containing portion and is covered on top with the phosphor-containing portion;
    after placing the resin sheet on the substrate, softening the resin sheet, with the frame surrounding and holding the side surfaces of the resin sheet, by heating such that the phosphor-containing portions are adhered to respective upper surfaces of the plurality of light-emitting elements, and the reflective material-containing portion or the phosphor-containing portions is/are adhered to side surfaces of the plurality of light-emitting elements; and
    curing the resin sheet and then cutting the substrate and the resin sheet to singulate individual light-emitting devices each comprising a light-emitting, element on the substrate, an annular reflector comprising the reflective material-containing portion and surrounding the light-emitting element, and a wavelength-converting layer comprising the phosphor-containing portion and covering an upper surface of the light-emitting element.

2. The method according to claim 1, wherein the resin sheet is softened while performing a degassing process.

3. The method according to claim 2, wherein the degassing process comprises a vacuum degassing.

4. The method according to claim 1, wherein the resin sheet is provided in a semi-cured state while being held by the frame.

5. The method according to claim 2, wherein the degassing process comprises a vibration degassing.

6. The method according to claim 1, further comprising:
    a resin film coupled to the phosphor-containing portion, wherein the resin film comprises a thermosetting resin and a transparent resin.

7. The method according to claim 1, wherein an upper portion of the phosphor-containing portions are covered with resin films.

8. The method according to claim 1, wherein the mounting of the plurality of light-emitting elements on the substrate comprises directly contacting the bottom surfaces of the plurality of light-emitting elements with the upper surface of the substrate.

9. The method according to claim 1, wherein, after the cutting the substrate and the resin sheet, the bottom surfaces of the plurality of light-emitting elements are devoid if a contact with the resin sheet that is cured.

10. The method according to claim 1, wherein, after the cutting the substrate and the resin sheet, an entirety of the bottom surfaces of the plurality of light-emitting elements are devoid of a contact with the resin sheet that is cured.

11. A method of manufacturing a light-emitting device, said method comprising:
    providing a resin sheet that comprises a lattice-patterned reflective material-containing portion and film-shaped phosphor-containing portions covering lattice openings of the reflective material-containing portion such that side surfaces of the resin sheet are surrounded and held by a frame;
    mounting a plurality of light-emitting elements on a substrate such that bottom surfaces of the plurality of light-emitting elements are disposed on an upper surface of the substrate;
    placing the resin sheet with the frame attached thereto on the substrate with the plurality of light-emitting elements mounted thereon while allowing the frame to surround and hold the side surfaces of the resin sheet such that each of the plurality of light-emitting elements is surrounded by the reflective material-containing portion and is covered on top with the phosphor-containing portion;

after placing the resin sheet on the substrate, softening the resin sheet, with the frame surrounding and holding the side surfaces of the resin sheet, by heating such that the phosphor-containing portions are adhered to respective upper surfaces of the plurality of light-emitting elements, and the reflective material-containing portion or the phosphor-containing portions is/are adhered to side surfaces of the plurality of light-emitting elements; and curing the resin sheet and then cutting the substrate and the resin sheet to singulate individual light-emitting devices each comprising a light-emitting element on the substrate, an annular reflector comprising the reflective material-containing portion and surrounding the light-emitting element, and a wavelength-converting layer comprising the phosphor-containing portion and covering an upper surface of the light-emitting element, wherein an upper surface of the phosphor-containing portion is covered with a single resin film, and wherein the resin film comprises a protective film for the wavelength-converting layer, and reduces an in-plane unevenness of light emission intensity while containing a light-scattering material.

12. The method according to claim 11, wherein the resin sheet is softened while performing a degassing process.

13. The method according to claim 11, wherein the resin sheet is provided in a semi-cured state while being held by the frame.

14. The method according to claim 12, wherein the degassing process comprises a vibration degassing.

15. The method according to claim 12, wherein the degassing process comprises a vacuum degassing.

16. A method of manufacturing a light-emitting device, said method comprising:

providing a resin sheet that comprises a lattice-patterned reflective material-containing portion and film-shaped phosphor-containing portions covering lattice openings of the reflective material-containing portion such that side surfaces of the resin sheet are surrounded and held by a frame;

mounting a plurality of light-emitting elements on a substrate such that bottom surfaces of the plurality of light-emitting elements are disposed on an upper surface of the substrate;

placing the resin sheet with the frame attached thereto on the substrate with the plurality of light-emitting elements mounted thereon while allowing the frame to surround and hold the side surfaces of the resin sheet such that each of the plurality of light-emitting elements is surrounded by the reflective material-containing portion and is covered on top with the phosphor-containing portion;

after placing the resin sheet on the substrate, softening the resin sheet, with the frame surrounding and holding the side surfaces of the resin sheet, by heating such that the phosphor-containing portions are adhered to respective upper surfaces of the plurality of light-emitting elements, and the reflective material-containing portion or the phosphor-containing portions is/are adhered to side surfaces of the plurality of light-emitting elements; and curing the resin sheet and then cutting the substrate and the resin sheet to singulate individual light-emitting devices each comprising a light-emitting element on the substrate, an annular reflector comprising the reflective material-containing portion and surrounding the light-emitting element, and a wavelength-converting layer comprising the phosphor-containing portion and covering an upper surface of the light-emitting element, wherein a resin sheet is configured that a single phosphor-containing portion covers an upper surface of the lattice-patterned reflective material-containing portion such that the lattice openings are covered, and wherein an upper surface of the phosphor-containing portion is covered with a single resin film.

17. The method according to claim 16, wherein the resin sheet is softened while performing a degassing process.

18. The method according to claim 16, wherein the resin sheet is provided in a semi-cured state while being held by the frame.

19. The method according to claim 17, wherein the degassing process comprises a vibration degassing.

20. The method according to claim 17, wherein the degassing process comprises a vacuum degassing.

* * * * *